United States Patent
Estrada et al.

(10) Patent No.: US 8,159,219 B2
(45) Date of Patent: Apr. 17, 2012

(54) MEMS 2D AND 3D MAGNETIC FIELD SENSORS AND ASSOCIATED MANUFACTURING METHOD

(75) Inventors: Horacio V. Estrada, Charlotte, NC (US); Yaroslav Maksymiv, Leland, NC (US)

(73) Assignee: University of North Carolina at Charlotte, Charlotte, NC (US)

( * ) Notice: Subject to any disclaimer, the term of this patent is extended or adjusted under 35 U.S.C. 154(b) by 826 days.

(21) Appl. No.: 12/254,433

(22) Filed: Oct. 20, 2008

(65) Prior Publication Data
US 2010/0097059 A1    Apr. 22, 2010

(51) Int. Cl.
*G01R 33/06* (2006.01)
(52) U.S. Cl. .......................... 324/251; 324/260
(58) Field of Classification Search .................. 324/251, 324/260
See application file for complete search history.

(56) References Cited

U.S. PATENT DOCUMENTS 4,987,467 A * 1/1991 Popovic ...................... 257/427
6,278,271 B1 * 8/2001 Schott .......................... 324/251

OTHER PUBLICATIONS

Dragana R. Popovic, Sasa Dimitrijevic, Marjan Blagojevic, Pavel Kejik, Enrico Schurig, and Radivoje S. Popovic; "Three-Axis Teslameter With Integrated Hall Probe"; IEEE Transactions on Instrumentation and Measurement, vol. 56, No. 4, Aug. 2007; Switzerland.

* cited by examiner

*Primary Examiner* — Reena Aurora
(74) *Attorney, Agent, or Firm* — Clements Bernard PLLC; Christopher L. Bernard; Lawrence A. Baratta, Jr.

(57) ABSTRACT

The disclosure provides Hall effect device configurations capable of measuring magnetic fields in two dimensions (2D) and three dimensions (3D) along with associated microelectromechanical system (MEMS) manufacturing methods. The present invention includes various geometric layout configurations for 2D and 3D Hall effect devices with multidimensional magnetic field sensing elements. Advantageously, the present invention can provide, simultaneously and independently, absolute measurement of each of the components (i.e., x-, y-, and z-components) of a magnetic field. Additionally, the geometric layout configurations enable the Hall effect devices to be constructed with MEMS fabrication techniques.

12 Claims, 12 Drawing Sheets

MEMS 2D AND 3D MAGNETIC FIELD SENSORS AND ASSOCIATED MANUFACTURING METHOD

FIELD OF THE INVENTION

The present invention relates generally to Hall effect-based devices. More specifically, the present invention provides multidimensional magnetic field sensing elements with Hall effect device configurations capable of measuring magnetic fields in two-dimensions (2D) and three-dimensions (3D) along with associated microelectromechanical system (MEMS) manufacturing methods.

BACKGROUND OF THE INVENTION

A Hall probe (also known as a Hall sensor) is a semiconductor-based detector which uses the Hall effect to measure the strength of a magnetic field. The probe provides an output voltage proportional to the magnitude of a magnetic field. In a conductive material, moving electrical charges (i.e., an electrical current) are affected by a nearby magnetic field. Bending (Lorentz) forces are experienced by the moving charges, which can be described by:

$$F_q = q \cdot v_q \times B = q \cdot |v_q| \times |B| \cdot \sin(\theta)$$

The result is what may be seen as an orthogonal charge drift, with a build up of either positive or negative charges on the bottom or on the top of the plate. The result of this interaction is a net accumulation of charges on one of the surfaces, and thus the generation of an electric field and a voltage across the terminals which are positioned on orthogonal points to the moving charges (current) and the magnetic field. This voltage (i.e., the Hall voltage) is proportional to the magnitude of the current and the magnetic field as well as the angle between the vectors representing them and the thickness of the conductive material, t. The Hall voltage can be represented as:

$$V_H = \frac{|I| \times |B| \cdot \sin(\theta)}{q \cdot n \cdot t}$$

Referring to FIG. 1, a conventional planar Hall probe 10 is illustrated for detecting one dimension (z-component) of a magnetic field, B, 12. The Hall probe 10 includes contacts 14a, 14b for applying an electric current, I, flowing through a conductive material 16, i.e. from contact 14a to contact 14b. Voltage terminals 18a, 18b are orthogonally located on the conductive material 16 to the contacts 14a, 14b. A voltage detector 20 can be connected to the terminals 18a, 18b to measure the Hall voltage, $V_H$.

The magnetic field 12 may include an x-component, $B_X$, a y-component, $B_Y$, and a z-component, $B_Z$. In FIG. 1, the z-component is illustrated perpendicular to the plane of the electric current, and the x-component and y-component are located on the same plane as the electric current. Accordingly, the Hall probe 10 is a uniaxial device which can only detect the z-component of the magnetic field 12.

In operation, the current is passed through the conductive material 16 which, when placed in the magnetic field 12, a Hall voltage develops across it. The Hall probe 10 may be held so that the magnetic field lines are passing at right angles through the probe (in FIG. 1, the z-component passes at right angles), the voltage detector 20 provides a reading of the value of the z-component of the magnetic flux density (B).

Conventionally, Hall probes can be used for positioning sensors, including angular orientation, for robotics, computing and manufacturing equipment; low-power contactless switching devices for electronic and communication equipment; contactless mechanical counters/rotational devices, for monitoring speed, rotational motion and position in automotive systems; magnetic field measurements, for geological and medical applications; proximity and orientation-sensors, for the low-cost industrial and automotive systems; and the like. Ideally, for all of these applications, small magnetic probes/elements, i.e. MEMS-based, can result in better performance, higher sensitivities, higher space resolutions, lower power consumption, better integration in the overall chip/system, overall low-manufacturing costs, and the like.

Microelectromechanical systems (MEMS) devices are generally made up of components between 1 to 100 micrometers in size (i.e. 0.001 to 0.1 mm) and MEMS devices generally range in size from 20 micrometers (20 millionth of a meter) to a millimeter. Advantageously, MEMS-based Hall probes could provide superior measurement resolution, low-power, improved integration into devices, and the like. However, it is difficult to realize two-dimensional (2D) and three-dimensional (3D) Hall probes simple MEMS processes.

Conventional attempts at multidimensional MEMS-based Hall probes have utilized magneto-transistors as well as a combined use of the Hall and magneto-resistive effects in conductive materials. These existing protocols/methods have several drawbacks including the need for adjustment and interconnection of the subunits, cross-sensitivity, complicated measuring protocols, as well as the fact that the three magnetic field components are not measured at the same point for 3D units.

BRIEF SUMMARY OF THE INVENTION

In various exemplary embodiments, the present invention provides Hall effect device configurations capable of measuring magnetic fields in 2D and 3D along with associated MEMS manufacturing methods. The present invention includes various geometric layout configurations for 2D and 3D Hall effect devices with multidimensional magnetic field sensing elements. Advantageously, the present invention can provide, simultaneously and independently, absolute measurement of each of the components (i.e., x-, y-, and z-components) of a magnetic field. Additionally, the geometric layout configurations enable the Hall effect devices to be constructed using various MEMS fabrication techniques.

In an exemplary embodiment of the present invention, a MEMS-based Hall probe includes a conductive material including a plurality of sides; a plurality of contacts disposed to the plurality of sides, wherein an electric current is applied to the plurality of contacts such that the electrical current flows through the conductive material; and a plurality of terminal pairs disposed to the plurality of sides. The MEMS-based Hall probe can further include a plurality of voltage measuring devices, wherein each of the plurality of voltage measuring devices are coupled to each of the plurality of terminal pairs to measure a voltage, and wherein the voltage is proportional to a magnetic field strength. The plurality of sides include a first side, a second side, a third side, a fourth side, a fifth side, and a sixth side; wherein the first side is adjacent to the second side, the second side is adjacent to the third side, the third side is adjacent to the fourth side, and the fourth side is adjacent to the first side; wherein the fifth side is adjacent to each of the first side, the second side, the third side, and the fourth side, the sixth side is adjacent to each of the first side, the second side, the third side, and the fourth side, and the fifth side is spaced apart from the sixth side.

Optionally, the MEMS-based Hall probe can be configured to measure a magnetic field strength in two dimensions; wherein the electric current flows from a first contact of the plurality of contacts disposed on the fifth side to a second contact of the plurality of contacts disposed on the sixth side; and wherein the plurality of terminals include a first terminal disposed on the first side, a second terminal disposed on the second side, a third terminal disposed on the third side, and a fourth terminal disposed on the fourth side. Alternatively, the MEMS-based Hall probe is configured to measure a magnetic field strength in three dimensions; wherein the electric current flows from a first contact disposed on the fifth side to a second contact disposed on the sixth side; and wherein the plurality of terminals include a first terminal disposed on the fifth side, a second terminal disposed on the fifth side, a third terminal disposed on the fifth side, a fourth terminal disposed on the sixth side, a fifth terminal disposed on the sixth side, and a sixth terminal disposed on the sixth side. The MEMS-based Hall probe can further include an x-component voltage measuring device connected to the first terminal and the fourth terminal; a y-component voltage measuring device connected to the second terminal and the fifth terminal; and a z-component voltage measuring device connected to the third terminal and the fifth terminal; wherein each of the x-component voltage measuring device, the y-component voltage measuring device, and the z-component voltage measuring device are configured to independently and separately measure a voltage proportional to an interaction of the electric current with a magnetic field.

Optionally, the MEMS-based Hall probe is configured to measure a magnetic field strength in three dimensions; wherein the plurality of contacts include a first contact, a second contact, a third contact, and a fourth contact, wherein the electric current flows from the first contact disposed on the fifth side to each of the second contact disposed on the fifth side, the third contact disposed on the sixth side, and the fourth contact disposed on the sixth side; and wherein the plurality of terminals include a first terminal disposed on the fifth side, a second terminal disposed on the fifth side, and a third terminal disposed on the sixth side. The MEMS-based Hall probe can further include an x-component voltage measuring device connected to the first terminal and the second terminal; a y-component voltage measuring device connected to the second terminal and the third terminal; and a z-component voltage measuring device connected to the first terminal and the second terminal; wherein each of the x-component voltage measuring device, the y-component voltage measuring device, and the z-component voltage measuring device are configured to independently and separately measure a voltage proportional to an interaction of the electric current with a magnetic field. The MEMS-based Hall probe can be fabricated by depositing multiple layers of a semiconducting material, and wherein the plurality of terminals and the plurality of contacts can be formed through micromachining of the multiple layers.

In another exemplary embodiment of the present invention, a MEMS-based Hall sensing device includes a plurality of one-dimensional Hall probes, wherein each of the plurality of one-dimensional Hall probes include a conductive material including an applied current flowing through the conductive material; and a pair of terminals disposed to the conductive material configured to measure a voltage orthogonal to the applied current responsive to an interaction between a magnetic field and the applied current. One-dimensional Hall probe pairs of the plurality of one-dimensional Hall probes are spaced apart from one another; wherein the each of the one-dimensional Hall probe pairs includes the applied current flowing in opposing directions; and wherein a combination of the voltage from each of the one-dimensional Hall probe pairs includes a voltage measurement at a mid-point between the one-dimensional Hall probe pairs.

Optionally, the plurality of one-dimensional Hall probes include a first horizontal Hall probe, a second horizontal Hall probe, a first vertical Hall probe, a second vertical Hall probe, a third vertical Hall probe, and a fourth vertical Hall probe; wherein the first horizontal Hall probe and the second horizontal Hall probe are spaced apart from one another, wherein the each of the first horizontal Hall probe and the second horizontal Hall probe includes the applied current flowing in opposing directions; and wherein a combination of the voltage from each of the first horizontal Hall probe and the second horizontal Hall probe includes a voltage measurement at a mid-point between the first horizontal Hall probe and the second horizontal Hall probe; wherein the first vertical Hall probe and the second vertical Hall probe are spaced apart from one another, wherein the each of the first vertical Hall probe and the second vertical Hall probe includes the applied current flowing in opposing directions; and wherein a combination of the voltage from each of the first vertical Hall probe and the second vertical Hall probe includes a voltage measurement at a mid-point between the first vertical Hall probe and the second vertical Hall probe; and wherein the third vertical Hall probe and the fourth vertical Hall probe are spaced apart from one another, wherein the each of the third vertical Hall probe and the fourth vertical Hall probe includes the applied current flowing in opposing directions; and wherein a combination of the voltage from each of the third vertical Hall probe and the fourth vertical Hall probe includes a voltage measurement at a mid-point between the third vertical Hall probe and the fourth vertical Hall probe.

Alternatively, the plurality of one-dimensional Hall probes include a first horizontal Hall probe, a second horizontal Hall probe, a third horizontal Hall probe, a fourth horizontal Hall probe, a first vertical Hall probe, and a second vertical Hall probe; wherein the first horizontal Hall probe and the second horizontal Hall probe are spaced apart from one another, wherein the each of the first horizontal Hall probe and the second horizontal Hall probe includes the applied current flowing in opposing directions; and wherein a combination of the voltage from each of the first horizontal Hall probe and the second horizontal Hall probe includes a voltage measurement at a mid-point between the first horizontal Hall probe and the second horizontal Hall probe; wherein the third horizontal Hall probe and the fourth horizontal Hall probe are spaced apart from one another, wherein the each of the third horizontal Hall probe and the fourth horizontal Hall probe includes the applied current flowing in opposing directions; and wherein a combination of the voltage from each of the third horizontal Hall probe and the fourth horizontal Hall probe includes a voltage measurement at a mid-point between the third horizontal Hall probe and the fourth horizontal Hall probe; and wherein the first vertical Hall probe and the second vertical Hall probe are spaced apart from one another, wherein the each of the first vertical Hall probe and the second vertical Hall probe includes the applied current flowing in opposing directions; and wherein a combination of the voltage from each of the first vertical Hall probe and the second vertical Hall probe includes a voltage measurement at a mid-point between the first vertical Hall probe and the second vertical Hall probe.

Optionally, the plurality of one-dimensional Hall probes include a first one-dimensional Hall probe and a second one dimensional Hall probe; wherein the MEMS-based Hall sensing device further includes a two-dimensional MEMS-based Hall probe which includes a conductive material including a first side, a second side, a third side, a fourth side, a fifth side, and a sixth side; a plurality of contacts disposed to the conductive material, wherein an electric current is applied to the plurality of contacts such that the electrical current flows through the conductive material; and a plurality of terminal pairs disposed to the conductive material; wherein the first side is adjacent to the second side, the second side is adjacent to the third side, the third side is adjacent to the fourth side, and the fourth side is adjacent to the first side; wherein the fifth side is adjacent to each of the first side, the second side, the third side, and the fourth side, the sixth side is adjacent to each of the first side, the second side, the third side, and the fourth side, and the fifth side is spaced apart from the sixth side; wherein the electric current flows from a first contact of the plurality of contacts disposed on the fifth side to a second contact of the plurality of contacts disposed on the sixth side; and wherein the plurality of terminals include a first terminal disposed on the first side, a second terminal disposed on the second side, a third terminal disposed on the third side, and a fourth terminal disposed on the fourth side; and wherein the first one-dimensional Hall probe and the second one-dimensional Hall probe are spaced apart from one another, wherein the each of the first one-dimensional Hall probe and the second one-dimensional Hall probe includes the applied current flowing in opposing directions; and wherein a combination of the voltage from each of the first one-dimensional Hall probe and the second one-dimensional Hall probe includes a voltage measurement at a mid-point between the first one-dimensional Hall probe and the second one-dimensional Hall probe; and wherein the two-dimensional MEMS-based Hall probe is located between the first one-dimensional Hall probe and the second one-dimensional Hall probe. The plurality of one-dimensional Hall probes can be fabricated utilizing chemical vapor deposition and patterning by on of chemical and reactive etching.

In yet another exemplary embodiment of the present invention, a method of manufacturing a MEMS-based Hall probe includes preparing a substrate wafer; depositing a semiconducting material on the substrate wafer; patterning a Hall probe out of the semiconducting material; and forming a sensing element for the Hall probe. The method can further include adding connections for applying an electrical current and for measuring a voltage across the semiconducting material. Optionally, the semiconducting material includes one of a polysilicon material and a mono-crystalline material. The patterning can include one of chemical and reactive etching, and the depositing can include chemical vapor deposition.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

In various exemplary embodiments, the present invention provides Hall effect device configurations capable of measuring magnetic fields in 2D and 3D along with associated MEMS manufacturing methods. The present invention includes various geometric layout configurations for 2D and 3D Hall effect devices with multidimensional magnetic field sensing elements. Advantageously, the present invention can provide, simultaneously and independently, absolute measurement of each of the components (i.e., x-, y-, and z-components) of a magnetic field. Additionally, the geometric layout configurations enable the Hall effect devices to be constructed with MEMS fabrication techniques.

In an exemplary embodiment, the Hall probe configuration can be either: (a) a cube, rectangular parallelepiped, parallelogram, or the like of polysilicon material, mono-crystalline material, or the like, or (b) a set of multiple plates, orthogonally positioned in space but separated from each other (box), including a generally small magnetic field Hall sensing element. The devices' main structure includes multiple layers of polysilicon material, mono-crystalline material, or the like, deposited on a silicon substrate or the like, patterned by surface micromachining processes or the like.

Advantageously, the present invention can be utilized to provide object orientation and tracking systems that use magnetic fields and Lorentz force (Hall-effect) devices to determine angular displacement values. It is related to magnetic field sensors, multi axes (2D- and 3D-) magnetic field sensing, MEMS-based microsensors, MEMS-based microsensors, 3D-magnetic field sensing, proximity sensors, angular positioning sensors, and the like. Small magnetic probes/ elements, such as the MEMS-based Hall effect devices described herein, result in better performance, higher sensitivities, higher space resolutions, lower power consumption, better integration in the overall chip/system, and overall low-manufacturing costs.

Figure 1:
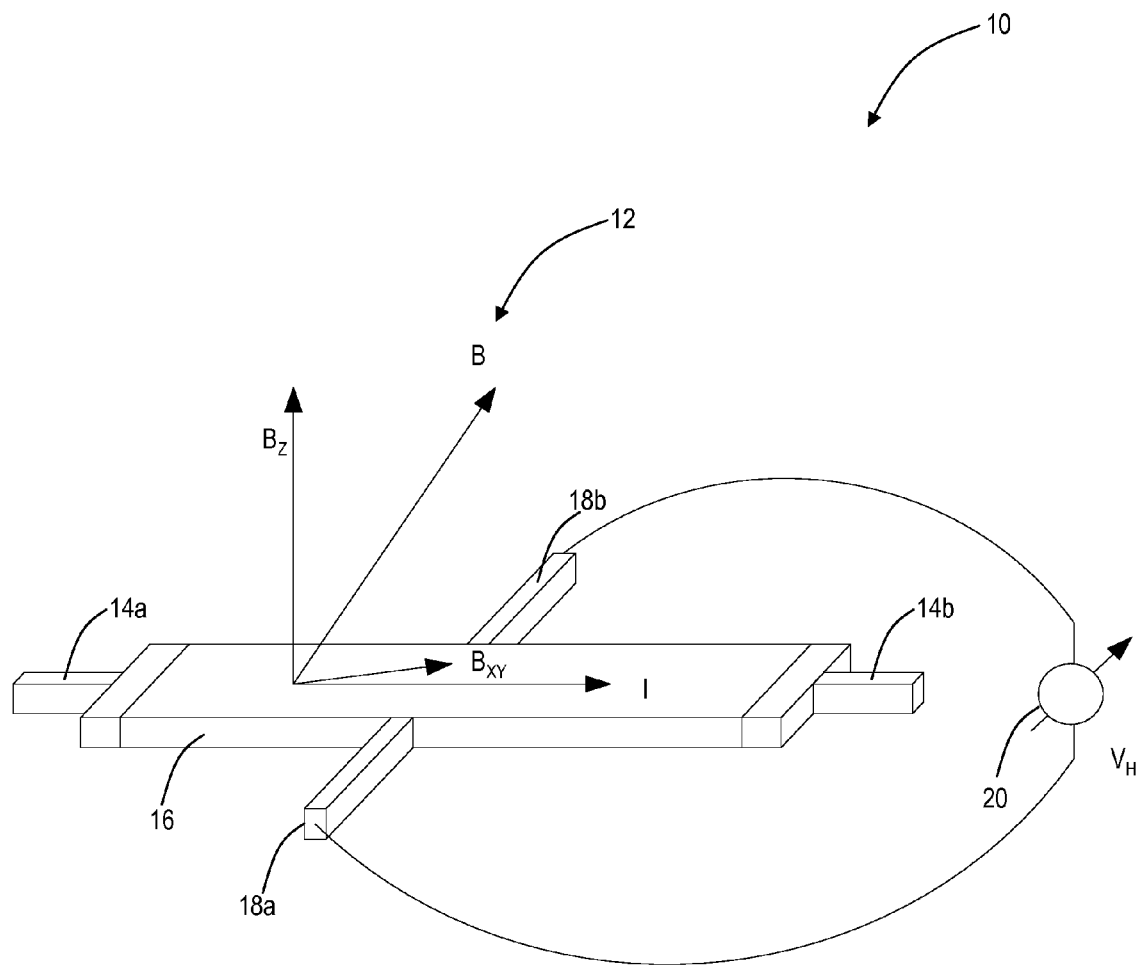
FIG. 1 is a diagram of a conventional planar Hall probe for detecting one dimension of a magnetic field, B.
Figure 2:
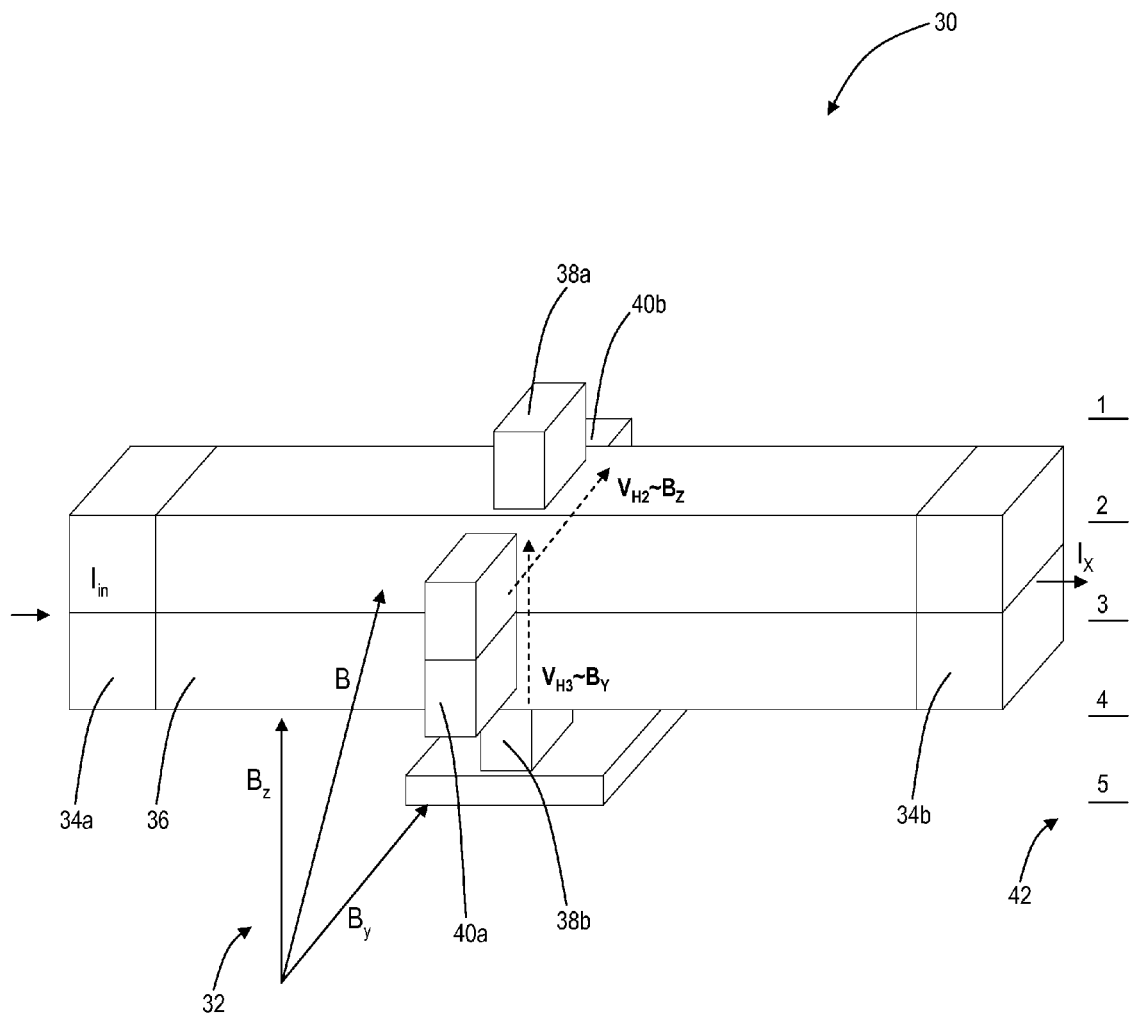
FIG. 2 is a diagram of a 2D Hall probe for measuring a magnetic field, B, according to an exemplary embodiment of the present invention.

Referring to FIG. 2, a 2D Hall probe 30 is illustrated for measuring a magnetic field 32 according to an exemplary embodiment of the present invention. The 2D Hall probe 30 includes contacts 34a, 34b located at separate ends of a conductive material 36. A current, $I_{in}$, flows through the conductive material 36 from the contact 34a to the contact 34b, $I_x$. Using Miller index notation, the current flows along the [100] direction. The magnetic field 32 includes an x-component, $B_X$, a y-component, $B_Y$, and a z-component, $B_Z$. In FIG. 2, the 2D Hall probe 30 is configured to measure the y-component and the z-component of the magnetic field 32.

In this exemplary embodiment, the 2D Hall probe 30 is a rectangular parallelepiped shape. Those of ordinary skill in the art will recognize that the 2D Hall probe 30 could be a cube or the like. The 2D Hall probe 30 includes four voltage terminals 38a, 38b, 40a, 40b disposed to the conductive material 36. The voltage terminals 38a, 38b, 40a, 40b are configured to measure two orthogonal Hall voltages, $V_{H3}$ and $V_{H2}$, along the z- and y-axes proportional to the y- and z-components of the magnetic field 32, respectively. The voltage terminals 38a, 38b are disposed to opposite sides of the conductive material 36 and are configured to measure the Hall voltage, $V_{H3}$, along the [001] direction. The voltage terminals 40a, 40b are disposed to opposite sides of the conductive material 36 and are configured to measure the Hall voltage, $V_{H2}$, along the [010] direction.

Advantageously, the 2D Hall probe 30 can be constructed in an extremely small form using MEMS technology. For example, the 2D Hall probe 30 can be obtained by integrating the voltage terminals 38a, 38b, 40a, 40b on the surfaces of a Hall-sensing silicon element. This can be achieved through surface micromachining (deposition and patterning) of polysilicon layers. Additionally, these sensors can also be fabricated on crystalline silicon with epitaxial layers deposited on top of a silicon wafer, to achieve higher sensitivities. The present invention provides a unique mechanism to fabricate and vertically integrate the 2D Hall probe 30. Otherwise, it would not be possible to manufacture the 2D Hall probe 30 considering the size of less than 10 micrometers in thickness and width.

In an exemplary embodiment, the 2D Hall probe 30 can be made with five layers 42 of polysilicon. The sensing element including the conductive material 36 and the contacts 34a, 34b is made of one to three layers of polysilicon (e.g., layers two through four, layers two and three, individual layers three or four, or the like), through which the applied currents flow (along the [100] direction). The voltage terminals 38a, 38b are defined via layers one and five to measure the Hall voltage, $V_{H3}$, along the [001] direction and extensions of the sensing elements for the voltage terminals 40a, 40b, to measure the Hall voltage, $V_{H2}$, along the [010] direction defined using the central layers.

Figure 3:
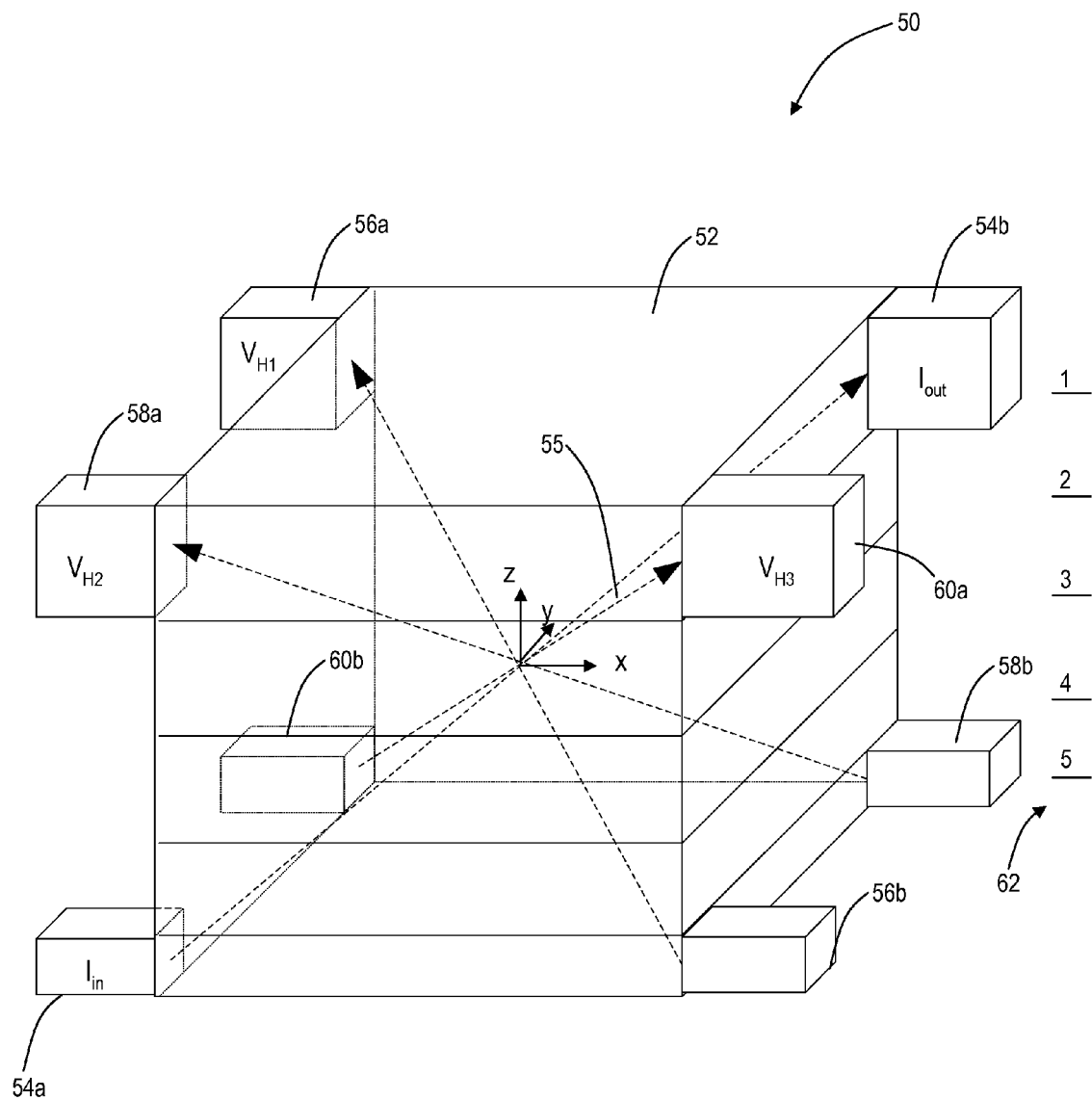
FIG. 3 is a diagram of a 3D Hall probe for simultaneously and independently measuring each component (i.e., x-, y-, and z-components) of a magnetic field according to an exemplary embodiment of the present invention.

Referring to FIG. 3, a 3D-Hall probe 50 is illustrated for simultaneously and independently measuring each component (i.e., x-, y-, and z-components) of a magnetic field according to an exemplary embodiment of the present invention. The 3D-Hall probe 50 includes a conductive material 52 in a cube shape, and those of ordinary skill in the art will recognize the conductive material 52 can include a rectangular parallelepiped shape or the like. The 3D-Hall probe 50 includes contacts 54a, 54b for a current to flow through the conductive material 52. In this exemplary embodiment, the contact 54a for current input, $I_{in}$, is disposed to a corner on one side of the conductive material 52. The contact 54b for current output, $I_{out}$, is disposed to an opposite corner on a side opposite to the one side of the conductive material 52. The contacts 54a, 54b define one of the main diagonals of the cubic structure forming the conductive material 52. Accordingly, the current, I, passes through the conductive material 52 along a [111]-direction 55 (using Miller index notation).

The 3D Hall probe 50 includes six voltage terminals 56a, 56b, 58a, 58b, 60a, 60b on the other six corners of the conductive material. The voltage terminals 56a, 56b, 58a, 58b, 60a, 60b are configured to independently measure the Hall voltages, $V_{H1}$, $V_{H2}$, and $V_{H3}$, generated by the interaction between the applied current in the direction 55 and external magnetic fields. Based on the geometry of the 3D Hall probe 50, the current is always perpendicular to each of the diagonals formed by the voltage terminals 56a, 56b, 58a, 58b, 60a, 60b. The voltage terminals 56a, 56b are configured to measure the Hall voltage, $V_{H1}$, along the [-111] direction (using Miller index notation). The voltage terminals 58a, 58b are configured to measure the Hall voltage, $V_{H2}$, along the [-1-11] direction (using Miller index notation). The voltage terminals 60a, 60b are configured to measure the Hall voltage, $V_{H3}$, along the [1-11] direction (using Miller index notation). Collectively, the Hall voltages, $V_{H1}$, $V_{H2}$, and $V_{H3}$, are proportional to the combined magnetic field's components along the x- and y-, x- and z-, and y- and z-components, respectively. Effectively, the 3D Hall probe 50 includes a structure with three orthogonal components of a magnetic field via three independent Hall voltage probes (i.e., voltage terminals 56a, 56b, 58a, 58b, 60a, 60b) positioned at opposite corners of the structure.

In an exemplary embodiment, the conductive material 52, the contacts 54a, 54b, and the voltage terminals 56a, 56b, 58a, 58b, 60a, 60b can be formed as a structure of polysilicon material made by depositing five layers 62 stacked on top of each other in a MEMS manufacturing process. Alternatively, the 3D Hall probe 50 could be formed with more or less layers 62 depending on the manufacturing process used, and the five layers 62 are shown for illustration purposes. Additionally, the 3D Hall probe 50 can also be fabricated on crystalline silicon with epitaxial layers deposited on top of a silicon wafer, to achieve higher sensitivities. In the five layer 62 manufacturing process, layers one and five include extensions for the contacts 54a, 54b and the voltage terminals 56a, 56b, 58a, 58b, 60a, 60b. Advantageously, the geometric structure of the 3D Hall probe 50 enables fabrication at microscopic levels, such as 100 micrometers by 100 micrometers.

Figure 4:
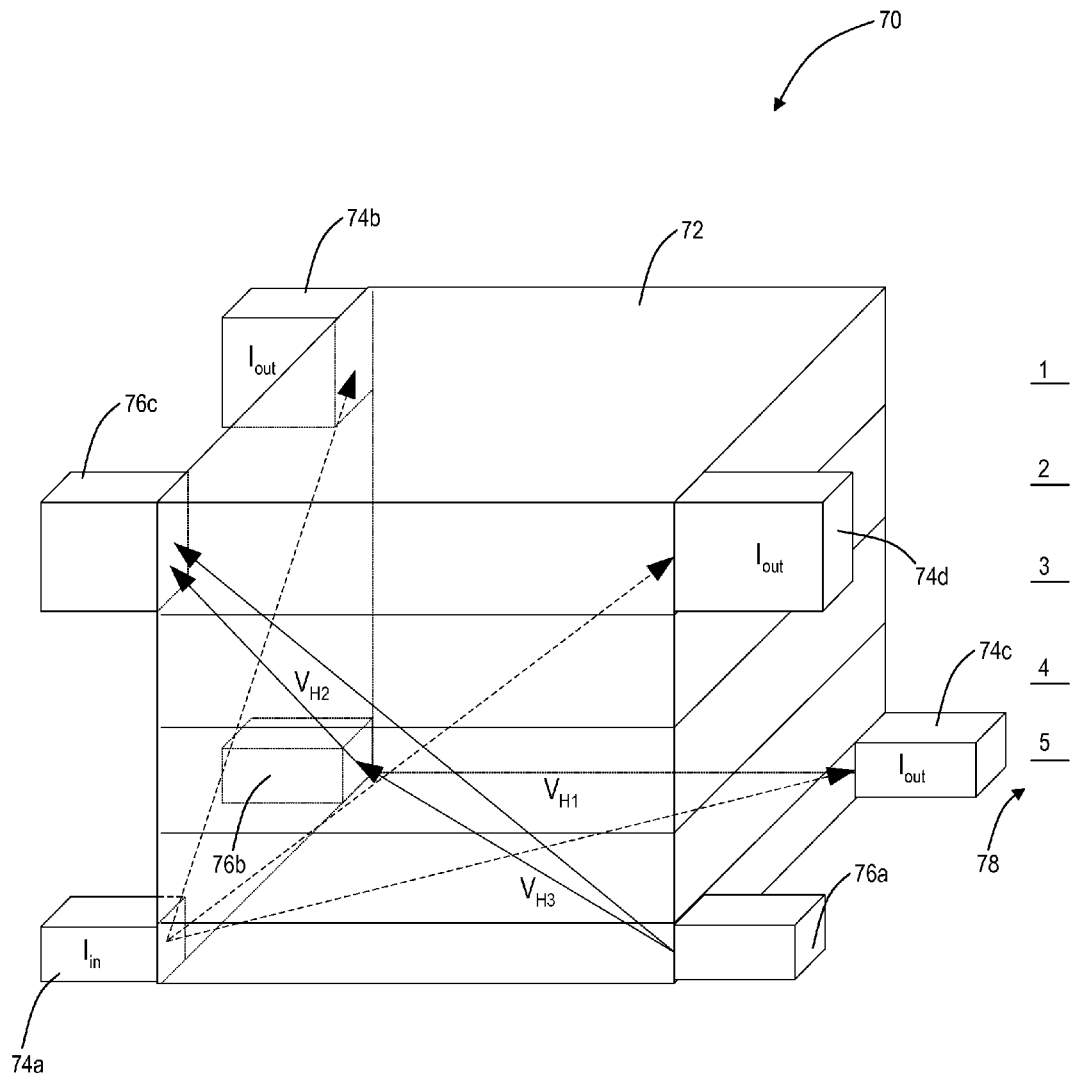
FIG. 4 is a diagram of a 3D Hall probe for simultaneously and independently measuring each component (i.e., x-, y-, and z-components) of a magnetic field according to another exemplary embodiment of the present invention.

Referring to FIG. 4, a 3D Hall probe 70 is illustrated for simultaneously and independently measuring each component (i.e., x-, y-, and z-components) of a magnetic field according to another exemplary embodiment of the present invention. The 3D Hall probe 70 provides similar functionality as the 3D Hall probe 50 with one less contact/terminal included in the structure. The 3D Hall probe 70 includes a conductive material 72 in a cube shape, and those of ordinary skill in the art will recognize the conductive material 72 can include a rectangular parallelepiped shape or the like.

The 3D Hall probe 70 includes four contacts 74a, 74b, 74c, 74d for an electric current to flow through the conductive material 72. In this exemplary embodiment, the contact 74a for current input, $I_{in}$, is disposed to a corner on a first side of the conductive material 72. Collectively, the contacts 74b, 74c, 74d provide output current, $I_{out}$, from the conductive material 72. The contact 74b is located on the first side at a diagonal corner from the contact 74a. The contact 74c is located on a second side opposing the first side at a diagonal corner from the contact 74a, and the contact 74d is located on the third side at an opposing corner from the contact 74a. Accordingly, the current applied at the contact 74a is split into three components that can be said to be along the [011], [110], and [101] directions (using Miller index notation).

The 3D Hall probe 70 includes three voltage terminals 76a, 76b, 76c for measuring Hall voltages, $V_{H1}$, $V_{H2}$, and $V_{H3}$. These Hall voltages, $V_{H1}$, $V_{H2}$, and $V_{H3}$, are generated by the interaction of the applied current and external magnetic fields, and are measured along three directions, [−101], [0−11], and [−110] directions (using Miller index notation), respectively. The required current is applied through the contact 74a at one corner to flow along three of the conductive material's 72 face-diagonals. The current exits through the three corners, i.e. contacts 74b, 74c, 74d, to set a charge interaction with the three orthogonal components of the magnetic field. The Hall voltages, $V_{H1}$, $V_{H2}$, and $V_{H3}$, can be individually or separately measured across the three terminals 76a, 76b, 76c. These corresponding voltage differences are proportional to the z-, x-, and y-components of the magnetic field, respectively.

In an exemplary embodiment, the conductive material 72, the contacts 74a, 74b, 74c, 74d, and the voltage terminals 76a, 76b, 76a, can be formed as a structure of polysilicon material made by depositing five layers 78 stacked on top of each other in a MEMS manufacturing process. Alternatively, the 3D Hall probe 70 could be formed with more or less layers 78 depending on the manufacturing process used, and the five layers 78 are shown for illustration purposes. Additionally, the 3D Hall probe 70 can also be fabricated on crystalline silicon with epitaxial layers deposited on top of a silicon wafer, to achieve higher sensitivities. In the five layer 78 manufacturing process, layers one and five include extensions for the contacts 74a, 74b, 74c, 74d and the voltage terminals 76a, 76b, 76a. Advantageously, the geometric structure of the 3D Hall probe 70 enables fabrication at microscopic levels, such as 100 micrometers by 100 micrometers.

Figure 5:
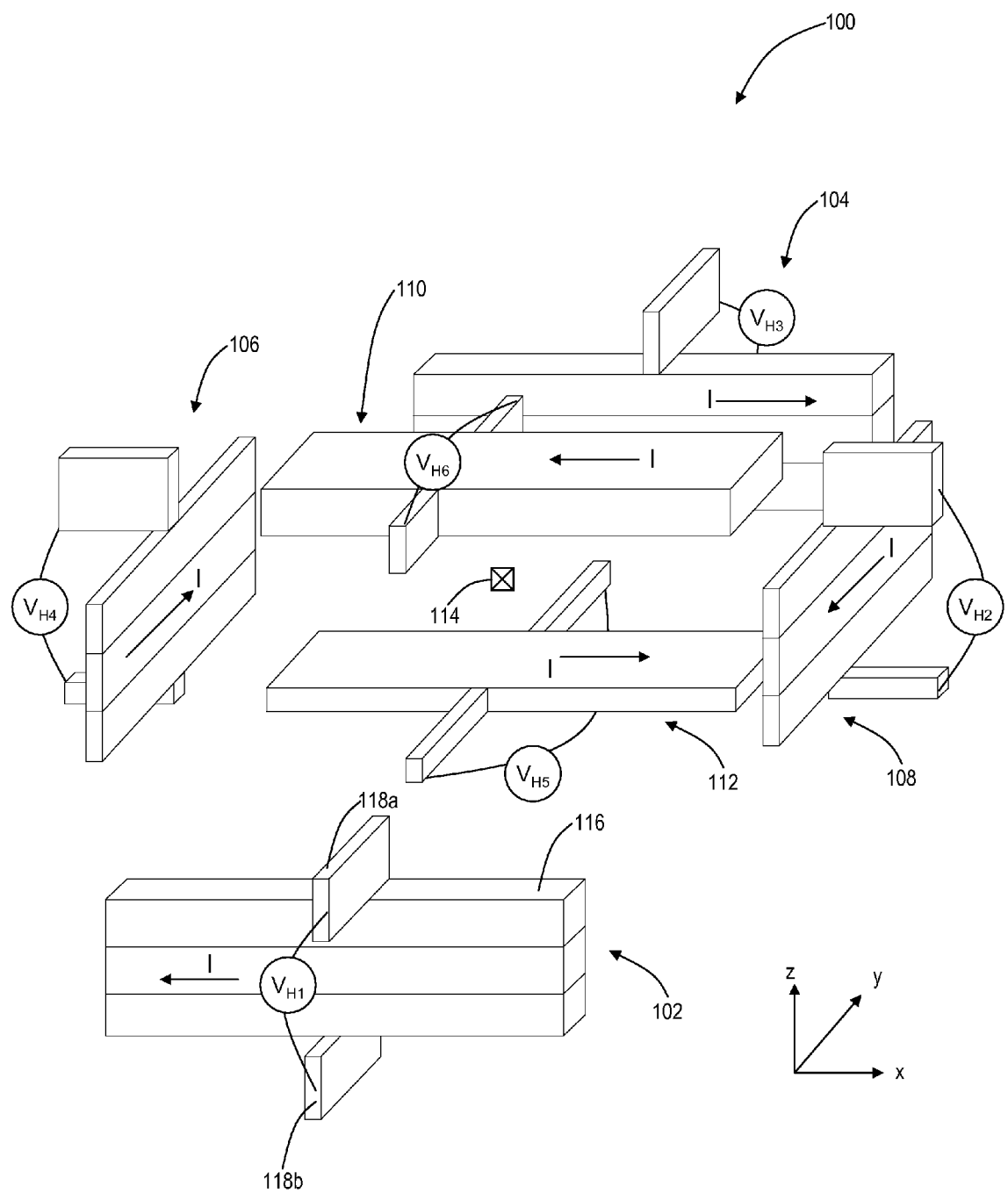
FIG. 5 is diagram of a 3D Hall probe realized by integrating two horizontal and four vertical 1D probes configured to measure the three components of a magnetic field at a center of the 3D Hall probe according to an exemplary embodiment of the present invention.

Referring to FIG. 5, a 3D Hall probe 100 is illustrated realized by integrating two horizontal and four vertical one dimension (1D) probes 102-112 configured to measure the three components of a magnetic field at a center 114 of the 3D Hall probe 100 according to an exemplary embodiment of the present invention. FIG. 5 illustrates an expanded view of the probes 102-112 to show the relationship of each of the probes. Those of ordinary skill in the art will recognize the various probes 102-112 are integrated into a single structure when fabricated utilizing MEMS technology.

The 3D Hall probe 100 includes a front vertical probe 102 configured to measure a Hall voltage, $V_{H1}$, a rear vertical probe 104 configured to measure a Hall voltage, $V_{H3}$, a left vertical probe 106 configured to measure a Hall voltage, $V_{H4}$, a right vertical probe 108 configured to measure a Hall voltage, $V_{H2}$, a top horizontal probe 110 configured to measure a Hall voltage, $V_{H6}$, and a bottom horizontal probe 112 configured to measure a Hall voltage, $V_{H5}$. Each of the probes 102-112 include a conductive material 116, voltage terminals 118a, 118b, and contacts (not shown) for input current, I. The input current, I, is configured to flow between the contacts (not shown) through the conductive material 116 for each probe 102-112. For example, in probe 102, the current, I, is illustrated flowing from left to right and in probe 104, the current, I, is illustrated flowing from right to left. Additionally, FIG. 5 illustrates the current, I, for the other probes 106-112. The current, I, flows through all six probes 102-112 using on-chip interconnecting wires or through extensions of corresponding layers (in MEMS fabrication).

Accordingly, a magnetic field interacts with the current, I, to generate the various Hall voltages. The Hall voltages can be electrically added when similar probes are interconnected to measure the voltages proportional to the magnetic field at the center 114 of the 3D Hall probe 100 (due to the orientation of the current, I). Hall voltages, $V_{H2}+V_{H4}$, $V_{H1}+V_{H3}$, and $V_{H5}+V_{H6}$, provide simultaneous information of the x-, y-, and z-components of the magnetic field, respectively, at the center 114.

Figure 6:
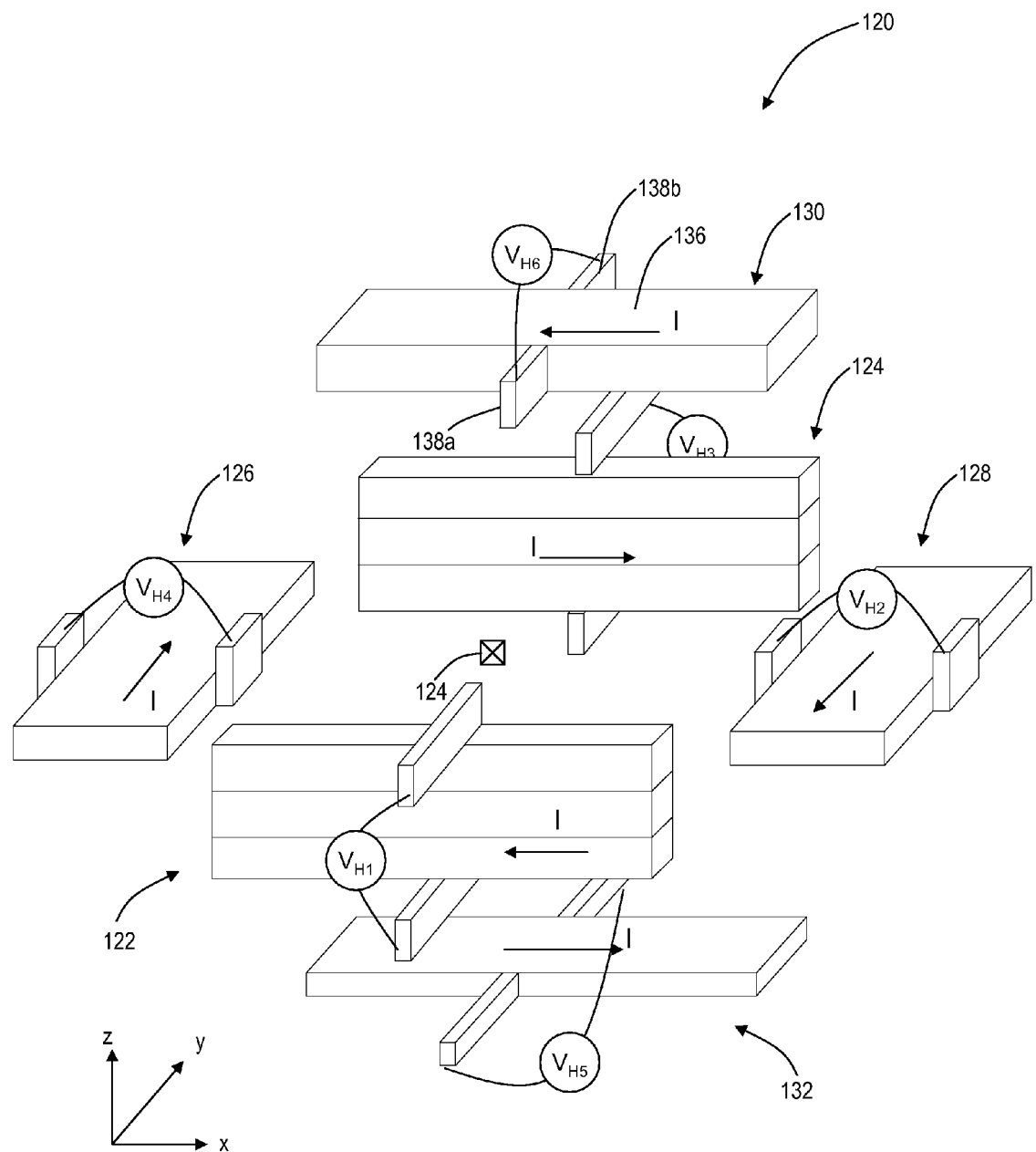
FIG. 6 is a diagram of a 3D Hall probe realized by integrating four horizontal and two vertical 1D probes configured to measure the three components of a magnetic field at a center of the 3D Hall probe according to another exemplary embodiment of the present invention.

Referring to FIG. 6, a 3D Hall probe 120 is illustrated realized by integrating four horizontal and two vertical 1D probes 122-132 configured to measure the three components of a magnetic field at a center 134 of the 3D Hall probe 120 according to another exemplary embodiment of the present invention. FIG. 6 illustrates an expanded view of the probes 122-132 to show the relationship of each of the probes. Those of ordinary skill in the art will recognize the various probes 122-132 are integrated into a single structure when fabricated utilizing MEMS technology.

The 3D Hall probe 100 includes a front vertical probe 122 configured to measure a Hall voltage, $V_{H1}$, a rear vertical probe 124 configured to measure a Hall voltage, $V_{H3}$, a left horizontal probe 126 configured to measure a Hall voltage, $V_{H4}$, a right horizontal probe 128 configured to measure a Hall voltage, $V_{H2}$, a top horizontal probe 130 configured to measure a Hall voltage, $V_{H6}$, and a bottom horizontal probe 112 configured to measure a Hall voltage, $V_{H5}$. Each of the probes 122-132 include a conductive material 136, voltage terminals 138a, 138b, and contacts (not shown) for input current, I. The input current, I, is configured to flow between the contacts (not shown) through the conductive material 136 for each probe 122-132. For example, in probe 122, the current, I, is illustrated flowing from right to left and in probe 124, the current, I, is illustrated flowing from left to right. Additionally, FIG. 5 illustrates the current, I, for the other probes 126-132. The current, I, flows through all six probes 122-132 using on-chip interconnecting wires or through extensions of corresponding layers (in MEMS fabrication).

Accordingly, a magnetic field interacts with the current, I, to generate the Hall voltages. The Hall voltages can be electrically added when similar probes are interconnected to measure the voltages proportional to the magnetic field at the center 134 of the 3D Hall probe 120. Hall voltages, $V_{H2}+V_{H4}$, $V_{H1}+V_{H3}$, and $V_{H5}+V_{H6}$, provide simultaneous information of the x-, y-, and z-components of the magnetic field, respectively, at the center 134.

In an exemplary embodiment, the 3D Hall probes 100, 120 can be fabricated using MEMS to create a structure that is approximately fifty microns in length and a few microns in height and thickness. For example, these 3D Hall probes 100, 120 can be made of six plates of polysilicon layers stacked "horizontally" or "vertically" based on the configuration. The actual individual probes' 102-112, 122-132 position has been arbitrarily placed in FIGS. 5 and 6 for illustration purposes. In an exemplary embodiment, the probes 100, 120 can be fabricated with a maximum volume of 200 micrometers by 200 micrometers in horizontal area and 15 micrometers in height, making these one of the smallest 3D Hall probes ever considered.

Those of ordinary skill will recognize various combinations of the 3D Hall probe of the present invention can be constructed from horizontal and vertical probe combinations. Advantageously, current flows through the conductive material of the probe such that two voltage measurements for each of the components (x-, y-, and z-components) of the magnetic field can be measured at a center point of the probe by adding the voltage measurements together.

Figure 7:
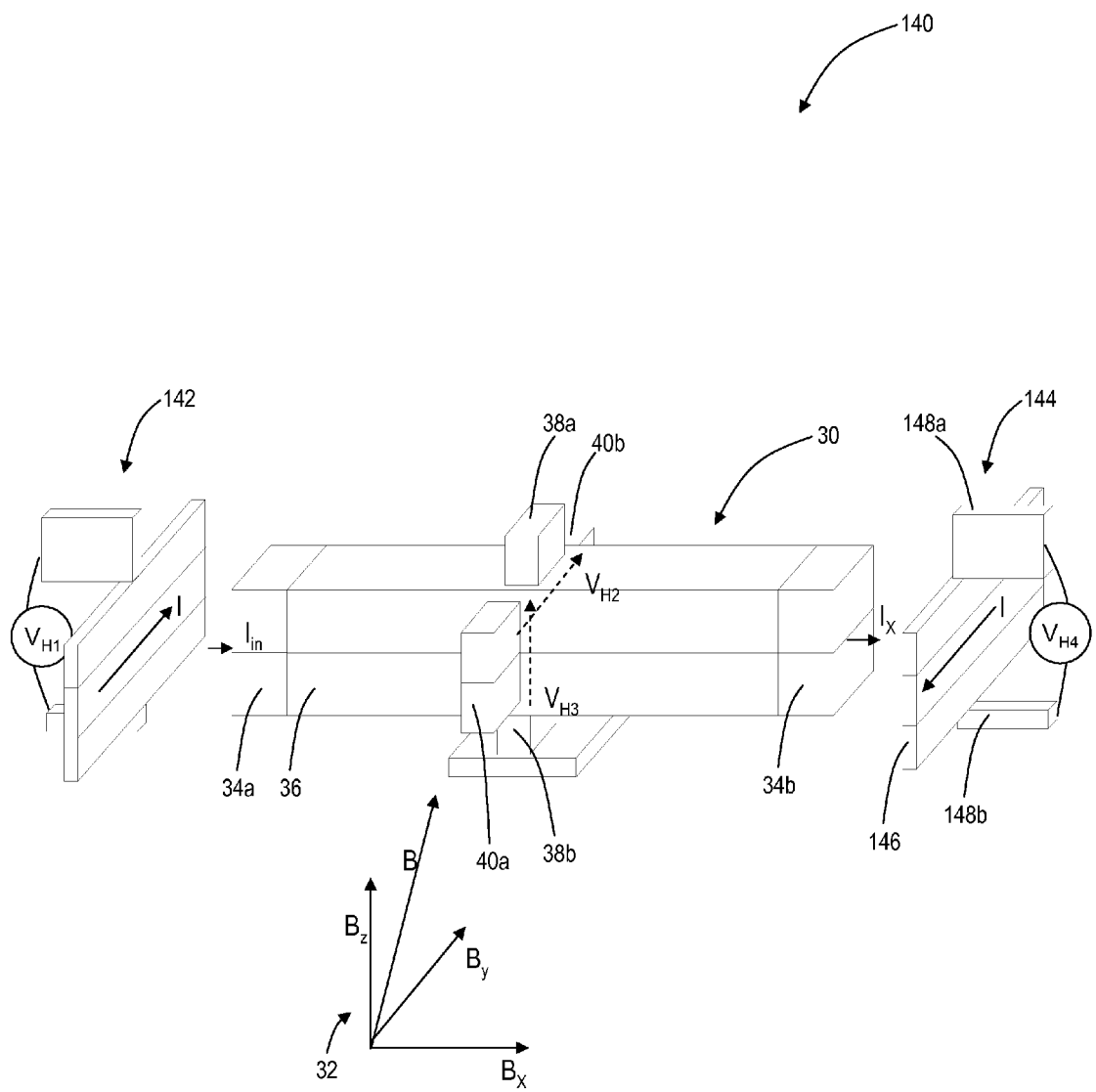
FIG. 7 is a diagram of a 3D Hall probe based on a combination of the 2D Hall probe of FIG. 2 with vertical 1D Hall probes according to yet another exemplary embodiment of the present invention.

Referring to FIG. 7, a 3D Hall probe 140 is illustrated based on a combination of the 2D Hall probe 30 of FIG. 2 with two vertical 1D-Hall probes 142, 144 according to yet another exemplary embodiment of the present invention. The 2D Hall probe 30 is configured to operate as described in FIG. 2 to provide a measurement of the two orthogonal Hall voltages, $V_{H2}$ and $V_{H3}$, along the y- and z-axes. The two vertical 1D Hall probes 142, 144 are configured to provide a measurement of the Hall voltage along the x-axis, by adding the voltages $V_{H1}$ and $V_{H4}$, at a midpoint between the probes 142, 144 along the conductive material 36.

Each of the vertical 1D Hall probes 142, 144 include a conductive material 146, voltage terminals 148a, 148b, and contacts (not shown) for current, I. The Hall probe 142 is configured to measure a Hall voltage, $V_{H1}$, and the Hall probe 144 is configured to measure a Hall voltage, $V_{H4}$. The resulting value of $V_{H1}+V_{H4}$ provides a value proportional to $B_x$ at a midpoint between the Hall probes 142, 144. Those of ordinary skill in the art will recognize that the 3D Hall probe 140 could also be constructed with horizontal 1D Hall probes instead of vertical 1D Hall probes.

Figure 8:
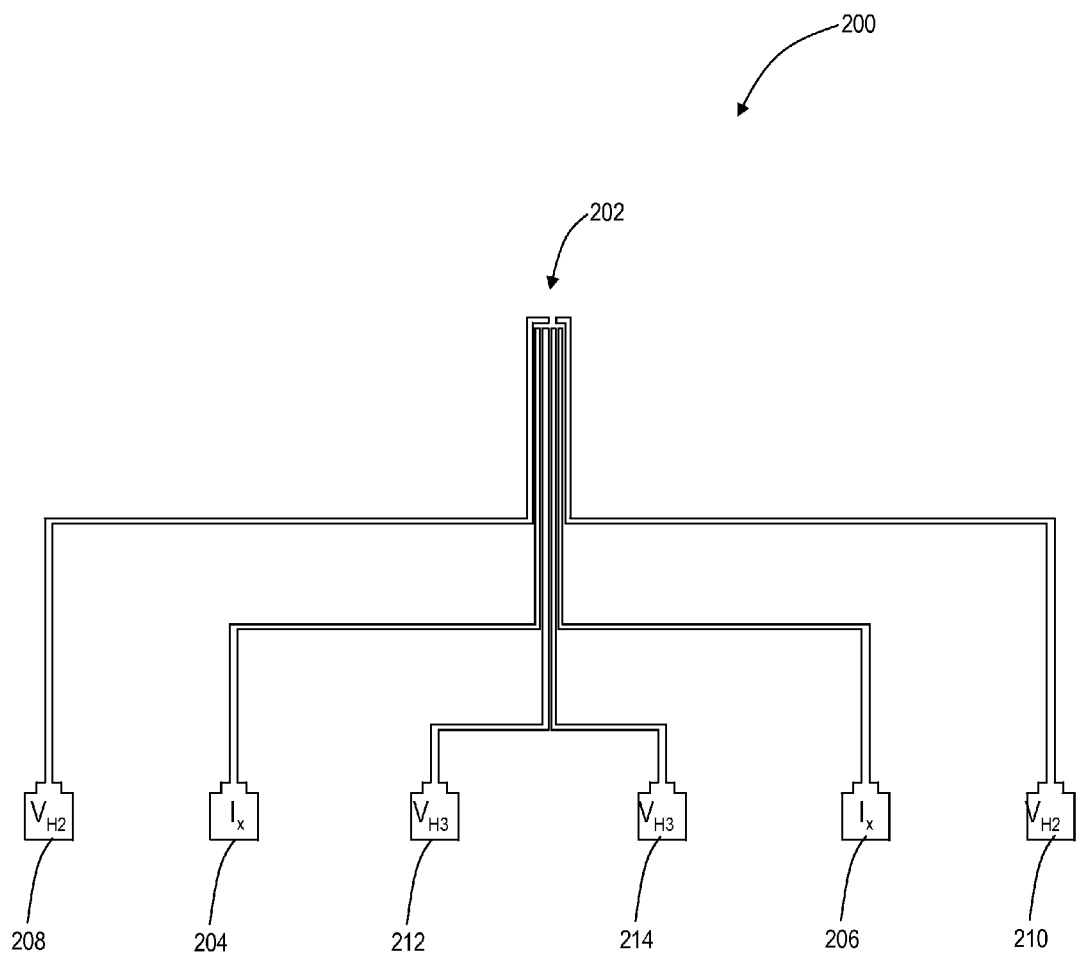
FIG. 8 is a diagram of a 2D Hall probe fabricated with MEMS technology according to an exemplary embodiment of the present invention.
Figure 9:
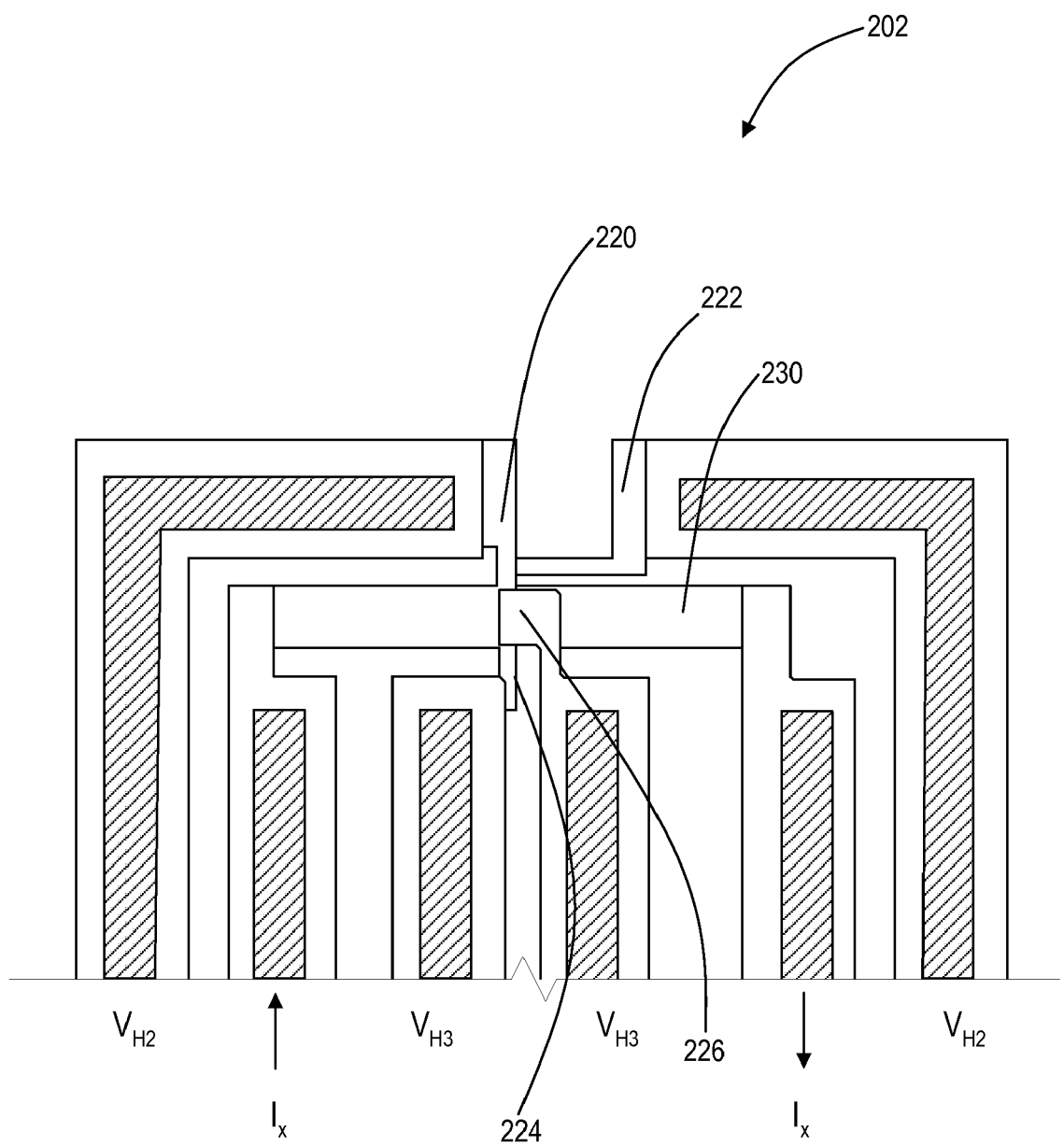
FIG. 9 is a close-up diagram of the Hall sensing elements of the 2D Hall probe of FIG. 8 according to an exemplary embodiment of the present invention.

Referring to FIGS. 8 and 9, a 2D Hall probe 200 fabricated with MEMS technology is illustrated according to an exemplary embodiment of the present invention. The 2D Hall probe 200 includes a sensing section 202 and a plurality of contacts 204-214 with leads connected to the sensing section 202. The plurality of contacts 204-214 can include metallic pads for an electrical connection to external devices or power supplies which be further grouped for smaller Hall-probes. The plurality of contacts 204-214 include current contacts, $I_x$, 204, 206 for applying a current to the sensing section, voltage contacts, $V_y$, 208, 210 for measuring a y-component voltage in the sensing section 202 responsive to an external magnetic field interacting with the current, and voltage contacts, $V_z$, 212, 214 for measuring a z-component voltage in the sensing section 202 responsive to an external magnetic field interacting with the current.

FIG. 9 illustrates a close-up view of the sensing section 202 fabricated with MEMS technology to provide a two-dimensional measurement through $V_y$ and $V_z$. The sensing section 202 includes voltage terminals 220, 222, 224, 226 to measure the Hall voltages, $V_y$ and $V_z$, generated by an interaction between a magnetic field and a current running through a conductive material 230. The voltage $V_y$ is measured across the terminals 220, 222, and the voltage $V_z$ is measured across the terminals 224, 226.

Figure 10:
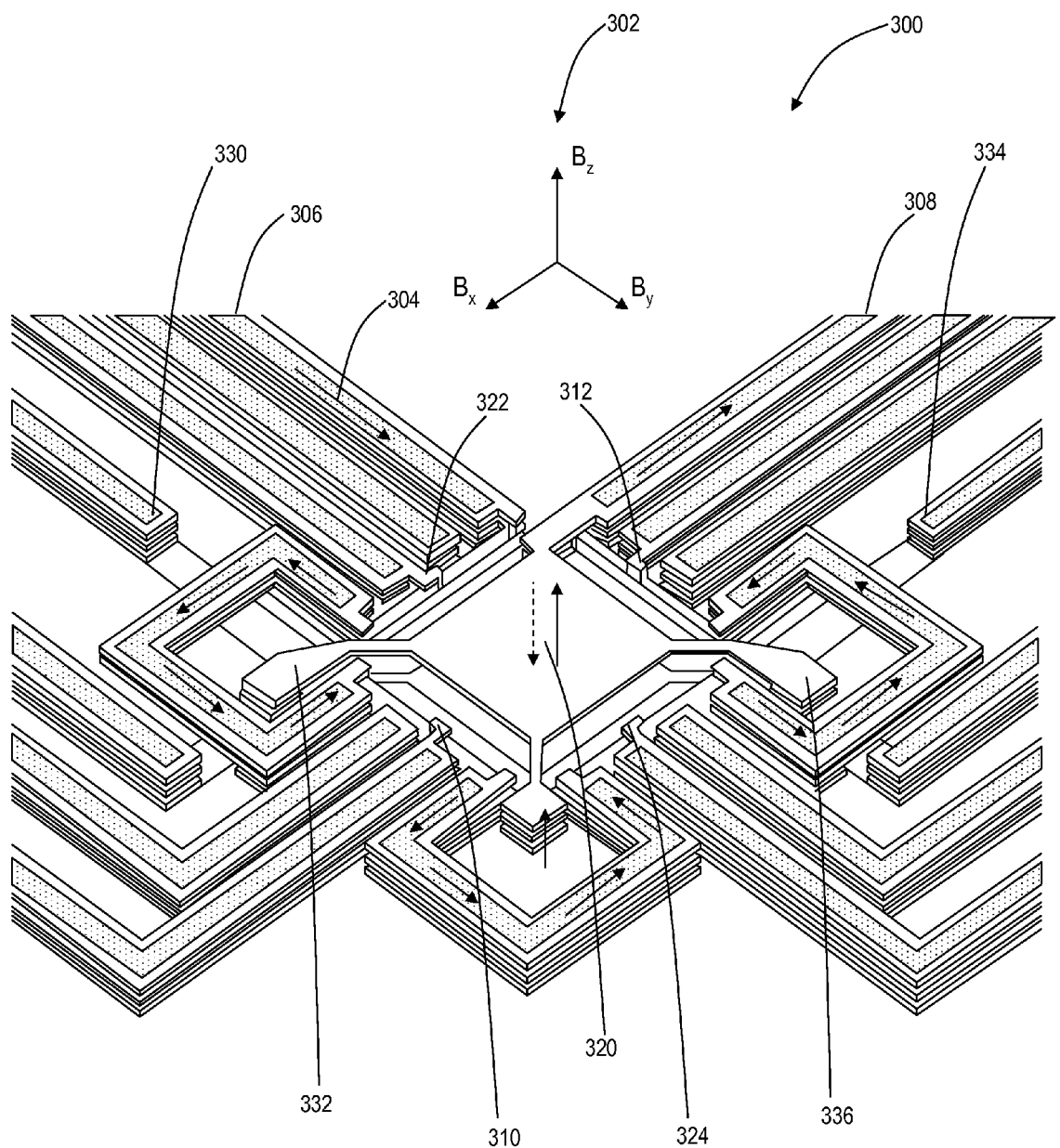
FIG. 10 is a diagram of a 3D Hall probe fabricated with MEMS technology according to an exemplary embodiment of the present invention.

Referring to FIG. 10, a 3D Hall probe 300 fabricated with MEMS technology is illustrated according to an exemplary embodiment of the present invention. The 3D Hall probe 300 is configured to simultaneously and independently measure three Hall voltages, $V_{H1}$, $V_{H2}$, $V_{H3}$ accordingly proportional to the three strength components of a magnetic field 302, generated by its interaction with the electric current (illustrated by arrows 304 in FIG. 10). The 3D Hall probe 300 includes a conductive material through which the electric current flows from point 306 to point 308 in FIG. 10.

The 3D Hall probe 300 measures the voltage, $V_{H1}$, at contacts 310, 312 and at two opposing contacts (not shown) below the contacts 310, 312, and a combination of these voltage measurements yields a value of the voltage, $V_{H1}$, at a mid-point 320. The 3D Hall probe 300 measures the voltage, $V_{H2}$, at contacts 322, 324 and at two opposing contacts (not shown) below the contacts 322, 324, and a combination of these voltage measurements yields a value of the voltage, $V_{H2}$, at a mid-point 320. The 3D Hall probe 300 measures the voltage, $V_{H3}$, at contacts 330, 332, 334, 336, and a combination of these voltage measurements (i.e. voltage between contacts 330, 332 and voltage between contacts 334, 336) yields a value of the voltage, $V_{H3}$, at a mid-point 320.

Figure 11:
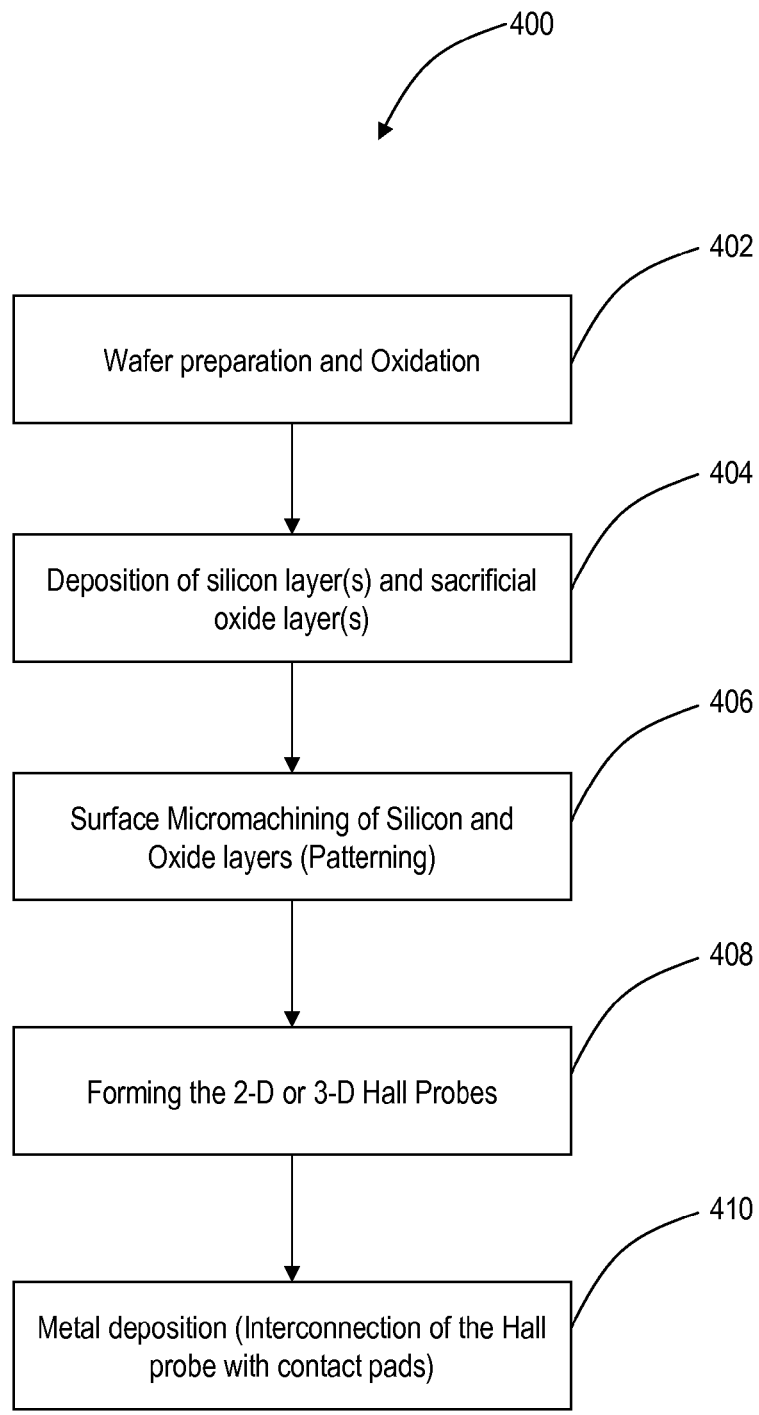
FIG. 11 is a flowchart of a process for manufacturing a Hall device utilizing MEMS according to an exemplary embodiment of the present invention.

Referring to FIG. 11, a flowchart illustrates a process 400 for manufacturing a Hall device utilizing MEMS according to an exemplary embodiment of the present invention. As described herein, the various Hall probes 30, 50, 70, 100, 120, 140, 200, 300 can be fabricated as either: (a) a cube, rectangular parallelepiped, parallelogram, or the like of semiconducting material or (b) a set of multiple plates, orthogonally positioned in space but separated from each other (box), including a generally small magnetic field Hall sensing element. The devices' main structure can include multiple layers of polysilicon material, mono-crystalline material, or the like, deposited on a silicon substrate or the like, patterned by surface micromachining processes.

The process 400 includes wafer preparation and oxidation (step 402), and deposition of silicon layer(s) and sacrificial oxide layer(s) (step 404). The semiconducting material can include a polycrystalline semiconducting material or mono-crystalline semiconducting material, or the like. The depositing step can include depositing multiple layers of the semiconducting material to form a stack, i.e. a cubic, rectangular parallelepiped element, or the like. The process 400 further includes surface micromachining of silicon and oxide layer (patterning) (step 406), and forming the 2-D or 3-D Hall probes (step 408). Finally, metal deposition occurs for interconnection of the Hall probe with contact pads (step 410).

For the first configuration (i.e., a cube, rectangular parallelepiped, parallelogram, or the like), the Hall probe (cube or rectangular parallelepiped) can be made by depositing multiple layers of conductive material or the like, stacked on each other to form a sensing cubic or rectangular parallelepiped element, deposited over a silicon substrate (wafer) coated with an insulating silicon nitride layer. For the second configuration (i.e., a set of multiple plates, orthogonally positioned in space but separated from each other), the device can be made of six orthogonally positioned sensing-plates, which can also be made of polysilicon material, mono-crystalline material, or the like with horizontally-oriented layers. The horizontal plates (top and bottom) can be deposited by chemical vapor deposition (CVD) mechanisms and patterning by chemical or reactive etching methods, separated by silicon oxide that is etched away upon completion of the device fabrication. Vertical plates can be made by stacking five layers of polysilicon material, mono-crystalline material, or the like patterned as each layer deposition is completed.

The present invention contemplates utilizing any MEMS-based fabrication mechanisms to realize any of the various Hall probes 30, 50, 70, 100, 120, 140, 200, 300. The structures of the various Hall probes 30, 50, 70, 100, 120, 140, 200, 300 lend themselves to construction at the nanometer and micrometer level. The present invention can utilize electroplating, sputter deposition, physical vapor deposition (PVD) and chemical vapor deposition (CVD), chemical etching, wet and dry etching, bulk micromachining, surface micromachining, high aspect ratio (HAR) micromachining, and the like. Those of ordinary skill in the art will recognize the present invention can also be extended to nanometer structures.

Figure 12:
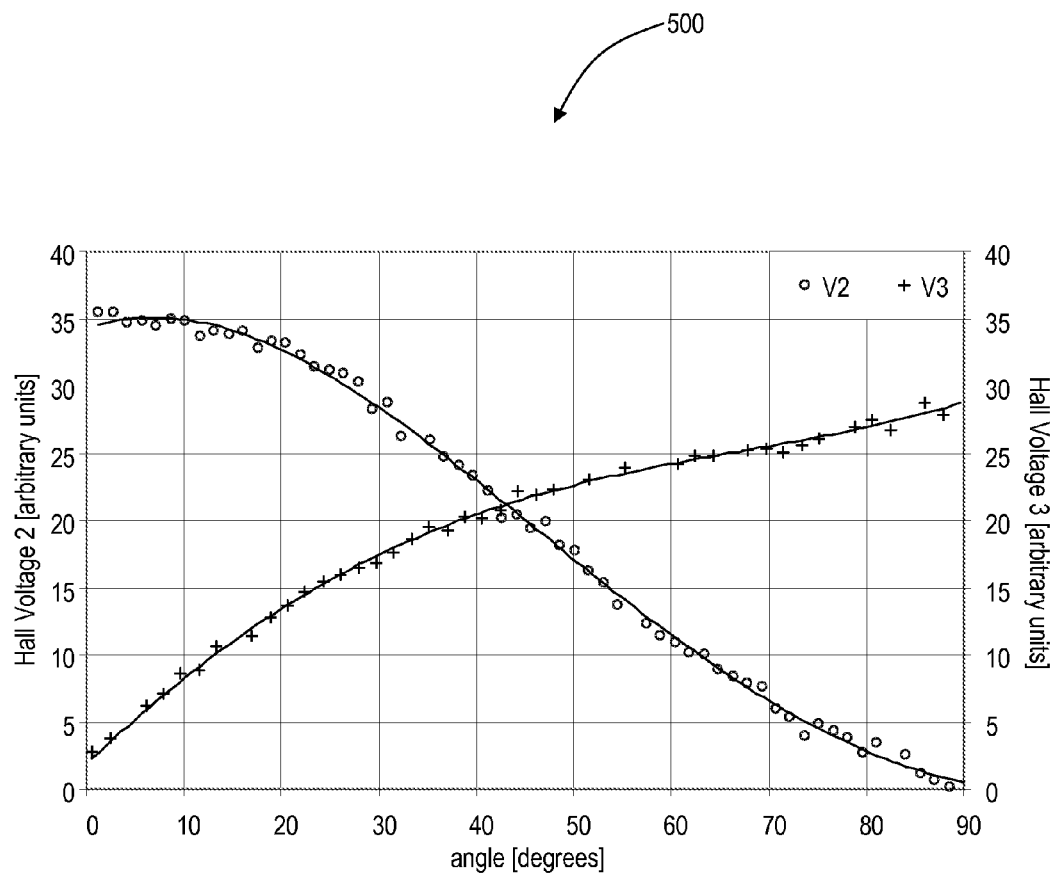
FIG. 12 is a diagram of the voltages obtained from the 2-D Hall probe of FIGS. 2, 9 and 10, showing the Hall voltage $V_{H2}$ and $V_{H3}$ measured as the probe is rotated around the probe's x-axis within a uni-dimensional constant magnetic field along the z-axis.

Referring to FIG. 12, a graph 500 illustrates voltages obtained from the 2-D Hall probe of FIGS. 2, 9 and 10, showing the Hall voltage $V_{H2}$ and $V_{H3}$ measured as the probe is rotated around the probe's x-axis within a uni-dimensional constant magnetic field along the z-axis.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A MEMS-based Hall probe, comprising:
    a conductive material comprising a plurality of sides;
    a plurality of contacts disposed to the plurality of sides, wherein an electric current is applied to the plurality of contacts such that the electrical current flows through the conductive material; and
    a plurality of terminal pairs disposed to the plurality of sides;
    wherein the plurality of sides comprise a first side, a second side, a third side, a fourth side, a fifth side, and a sixth side;
    wherein the first side is adjacent to the second side, the second side is adjacent to the third side, the third side is adjacent to the fourth side, and the fourth side is adjacent to the first side;
    wherein the fifth side is adjacent to each of the first side, the second side, the third side, and the fourth side, the sixth side is adjacent to each of the first side, the second side, the third side, and the fourth side, and the fifth side is spaced apart from the sixth side;
    wherein the MEMS-based Hall probe is configured to measure a magnetic field strength in two dimensions;
    wherein the electric current flows from a first contact of the plurality of contacts disposed on the fifth side to a second contact of the plurality of contacts disposed on the sixth side; and
    wherein the plurality of terminals comprise a first terminal disposed on the first side, a second terminal disposed on the second side, a third terminal disposed on the third side, and a fourth terminal disposed on the fourth side.

2. The MEMS-based Hall probe of claim 1, further comprising:
    a plurality of voltage measuring devices, wherein each of the plurality of voltage measuring devices are coupled to each of the plurality of terminal pairs to measure a voltage, and wherein the voltage is proportional to a magnetic field strength.

3. The MEMS-based Hall probe of claim 1, wherein the MEMS-based Hall probe is fabricated by depositing multiple layers of a semiconducting material, and wherein the plurality of terminals and the plurality of contacts are formed through micromachining of the multiple layers.

4. A MEMS-based Hall probe, comprising:
    a conductive material comprising a plurality of sides;
    a plurality of contacts disposed to the plurality of sides, wherein an electric current is applied to the plurality of contacts such that the electrical current flows through the conductive material; and
    a plurality of terminal pairs disposed to the plurality of sides;
    wherein the plurality of sides comprise a first side, a second side, a third side, a fourth side, a fifth side, and a sixth side;
    wherein the first side is adjacent to the second side, the second side is adjacent to the third side, the third side is adjacent to the fourth side, and the fourth side is adjacent to the first side;
    wherein the fifth side is adjacent to each of the first side, the second side, the third side, and the fourth side, the sixth side is adjacent to each of the first side, the second side, the third side, and the fourth side, and the fifth side is spaced apart from the sixth side;
    wherein the MEMS-based Hall probe is configured to measure a magnetic field strength in three dimensions;
    wherein the electric current flows from a first contact disposed on the fifth side to a second contact disposed on the sixth side; and
    wherein the plurality of terminals comprise a first terminal disposed on the fifth side, a second terminal disposed on the fifth side, a third terminal disposed on the fifth side, a fourth terminal disposed on the sixth side, a fifth terminal disposed on the sixth side, and a sixth terminal disposed on the sixth side.

5. The MEMS-based Hall probe of claim 4, further comprising:
    an x-component voltage measuring device connected to the first terminal and the fourth terminal;
    a y-component voltage measuring device connected to the second terminal and the fifth terminal; and
    a z-component voltage measuring device connected to the third terminal and the fifth terminal;
    wherein each of the x-component voltage measuring device, the y-component voltage measuring device, and the z-component voltage measuring device are configured to independently and separately measure a voltage proportional to an interaction of the electric current with a magnetic field.

6. A MEMS-based Hall probe, comprising:
    a conductive material comprising a plurality of sides;
    a plurality of contacts disposed to the plurality of sides, wherein an electric current is applied to the plurality of contacts such that the electrical current flows through the conductive material; and
    a plurality of terminal pairs disposed to the plurality of sides;
    wherein the plurality of sides comprise a first side, a second side, a third side, a fourth side, a fifth side, and a sixth side;
    wherein the first side is adjacent to the second side, the second side is adjacent to the third side, the third side is adjacent to the fourth side, and the fourth side is adjacent to the first side;
    wherein the fifth side is adjacent to each of the first side, the second side, the third side, and the fourth side, the sixth side is adjacent to each of the first side, the second side, the third side, and the fourth side, and the fifth side is spaced apart from the sixth side;
    wherein the MEMS-based Hall probe is configured to measure a magnetic field strength in three dimensions;
    wherein the plurality of contacts comprise a first contact, a second contact, a third contact, and a fourth contact, wherein the electric current flows from the first contact disposed on the fifth side to each of the second contact disposed on the fifth side, the third contact disposed on the sixth side, and the fourth contact disposed on the sixth side; and
    wherein the plurality of terminals comprise a first terminal disposed on the fifth side, a second terminal disposed on the fifth side, and a third terminal disposed on the sixth side.

7. The MEMS-based Hall probe of claim 6, further comprising:
    an x-component voltage measuring device connected to the first terminal and the second terminal;
    a y-component voltage measuring device connected to the second terminal and the third terminal; and
    a z-component voltage measuring device connected to the first terminal and the second terminal;

wherein each of the x-component voltage measuring device, the y-component voltage measuring device, and the z-component voltage measuring device are configured to independently and separately measure a voltage proportional to an interaction of the electric current with a magnetic field.

8. A MEMS-based Hall sensing device, comprising:
a plurality of one-dimensional Hall probes, wherein each of the plurality of one-dimensional Hall probes comprise:
  a conductive material comprising an applied current flowing through the conductive material; and
  a pair of terminals disposed to the conductive material configured to measure a voltage orthogonal to the applied current responsive to an interaction between a magnetic field and the applied current
wherein one-dimensional Hall probe pairs of the plurality of one-dimensional Hall probes are spaced apart from one another;
wherein the each of the one-dimensional Hall probe pairs comprises the applied current flowing in opposing directions; and
wherein a combination of the voltage from each of the one-dimensional Hall probe pairs comprises a voltage measurement at a mid-point between the one-dimensional Hall probe pairs.

9. The MEMS-based Hall sensing device of claim 8, wherein the plurality of one-dimensional Hall probes are fabricated utilizing chemical vapor deposition and patterning by one of chemical and reactive etching.

10. A MEMS-based Hall sensing device, comprising:
a plurality of one-dimensional Hall probes, wherein each of the plurality of one-dimensional Hall probes comprise:
  a conductive material comprising an applied current flowing through the conductive material; and
  a pair of terminals disposed to the conductive material configured to measure a voltage orthogonal to the applied current responsive to an interaction between a magnetic field and the applied current;
wherein the plurality of one-dimensional Hall probes comprise a first horizontal Hall probe, a second horizontal Hall probe, a first vertical Hall probe, a second vertical Hall probe, a third vertical Hall probe, and a fourth vertical Hall probe;
wherein the first horizontal Hall probe and the second horizontal Hall probe are spaced apart from one another, wherein the each of the first horizontal Hall probe and the second horizontal Hall probe comprises the applied current flowing in opposing directions; and wherein a combination of the voltage from each of the first horizontal Hall probe and the second horizontal Hall probe comprises a voltage measurement at a mid-point between the first horizontal Hall probe and the second horizontal Hall probe;
wherein the first vertical Hall probe and the second vertical Hall probe are spaced apart from one another, wherein the each of the first vertical Hall probe and the second vertical Hall probe comprises the applied current flowing in opposing directions; and wherein a combination of the voltage from each of the first vertical Hall probe and the second vertical Hall probe comprises a voltage measurement at a mid-point between the first vertical Hall probe and the second vertical Hall probe; and
wherein the third vertical Hall probe and the fourth vertical Hall probe are spaced apart from one another, wherein the each of the third vertical Hall probe and the fourth vertical Hall probe comprises the applied current flowing in opposing directions; and wherein a combination of the voltage from each of the third vertical Hall probe and the fourth vertical Hall probe comprises a voltage measurement at a mid-point between the third vertical Hall probe and the fourth vertical Hall probe.

11. A MEMS-based Hall sensing device, comprising:
a plurality of one-dimensional Hall probes, wherein each of the plurality of one-dimensional Hall probes comprise:
  a conductive material comprising an applied current flowing through the conductive material; and
  a pair of terminals disposed to the conductive material configured to measure a voltage orthogonal to the applied current responsive to an interaction between a magnetic field and the applied current;
wherein the plurality of one-dimensional Hall probes comprise a first horizontal Hall probe, a second horizontal Hall probe, a third horizontal Hall probe, a fourth horizontal Hall probe, a first vertical Hall probe, and a second vertical Hall probe;
wherein the first horizontal Hall probe and the second horizontal Hall probe are spaced apart from one another, wherein the each of the first horizontal Hall probe and the second horizontal Hall probe comprises the applied current flowing in opposing directions; and wherein a combination of the voltage from each of the first horizontal Hall probe and the second horizontal Hall probe comprises a voltage measurement at a mid-point between the first horizontal Hall probe and the second horizontal Hall probe;
wherein the third horizontal Hall probe and the fourth horizontal Hall probe are spaced apart from one another, wherein the each of the third horizontal Hall probe and the fourth horizontal Hall probe comprises the applied current flowing in opposing directions; and wherein a combination of the voltage from each of the third horizontal Hall probe and the fourth horizontal Hall probe comprises a voltage measurement at a mid-point between the third horizontal Hall probe and the fourth horizontal Hall probe; and
wherein the first vertical Hall probe and the second vertical Hall probe are spaced apart from one another, wherein the each of the first vertical Hall probe and the second vertical Hall probe comprises the applied current flowing in opposing directions; and wherein a combination of the voltage from each of the first vertical Hall probe and the second vertical Hall probe comprises a voltage measurement at a mid-point between the first vertical Hall probe and the second vertical Hall probe.

12. A MEMS-based Hall sensing device, comprising:
a plurality of one-dimensional Hall probes, wherein each of the plurality of one-dimensional Hall probes comprise:
  a conductive material comprising an applied current flowing through the conductive material; and
  a pair of terminals disposed to the conductive material configured to measure a voltage orthogonal to the applied current responsive to an interaction between a magnetic field and the applied current;
wherein the plurality of one-dimensional Hall probes comprise a first one-dimensional Hall probe and a second one-dimensional Hall probe;
wherein the MEMS-based Hall sensing device further comprises a two-dimensional MEMS-based Hall probe comprising:

a conductive material comprising a first side, a second side, a third side, a fourth side, a fifth side, and a sixth side;

a plurality of contacts disposed to the conductive material, wherein an electric current is applied to the plurality of contacts such that the electrical current flows through the conductive material; and a plurality of terminal pairs disposed to the conductive material;

wherein the first side is adjacent to the second side, the second side is adjacent to the third side, the third side is adjacent to the fourth side, and the fourth side is adjacent to the first side;

wherein the fifth side is adjacent to each of the first side, the second side, the third side, and the fourth side, the sixth side is adjacent to each of the first side, the second side, the third side, and the fourth side, and the fifth side is spaced apart from the sixth side;

wherein the electric current flows from a first contact of the plurality of contacts disposed on the fifth side to a second contact of the plurality of contacts disposed on the sixth side;

wherein the plurality of terminals comprise a first terminal disposed on the first side, a second terminal disposed on the second side, a third terminal disposed on the third side, and a fourth terminal disposed on the fourth side;

wherein the first one-dimensional Hall probe and the second one-dimensional Hall probe are spaced apart from one another, wherein the each of the first one-dimensional Hall probe and the second one-dimensional Hall probe comprises the applied current flowing in opposing directions; and wherein a combination of the voltage from each of the first one-dimensional Hall probe and the second one-dimensional Hall probe comprises a voltage measurement at a mid-point between the first one-dimensional Hall probe and the second one-dimensional Hall probe; and wherein the two-dimensional MEMS-based Hall probe is located between the first one-dimensional Hall probe and the second one-dimensional Hall probe.

* * * * *